(12) United States Patent
Yamamoto et al.

(10) Patent No.: US 6,709,174 B2
(45) Date of Patent: Mar. 23, 2004

(54) APPARATUS AND METHOD FOR DEVELOPMENT

(75) Inventors: Taro Yamamoto, Kikuchi-gun (JP); Akihiro Fujimoto, Kikuchi-gun (JP); Kousuke Yoshihara, Kikuchi-gun (JP); Hideharu Kyouda, Kikuchi-gun (JP); Hirofumi Takeguchi, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/271,588

(22) Filed: Oct. 17, 2002

(65) Prior Publication Data

US 2003/0077083 A1 Apr. 24, 2003

(30) Foreign Application Priority Data

Oct. 19, 2001 (JP) ........................................ 2001-322003

(51) Int. Cl.$^7$ ................................................. G03D 5/00
(52) U.S. Cl. ...................... 396/604; 396/611; 396/627; 118/52; 427/420
(58) Field of Search ................................. 396/604, 611, 396/627; 118/52–56, 319; 427/420, 421

(56) References Cited

U.S. PATENT DOCUMENTS 5,571,560 A * 11/1996 Lin ............................ 427/240
6,012,858 A * 1/2000 Konishi et al. .............. 396/611
6,068,881 A * 5/2000 Valley et al. ................ 427/240
6,190,063 B1 * 2/2001 Akimoto ..................... 396/611
2001/0014536 A1 * 8/2001 Nakamura et al. .......... 438/689

FOREIGN PATENT DOCUMENTS

JP      2002-252198      * 9/2002

* cited by examiner

Primary Examiner—D. Rutledge
(74) Attorney, Agent, or Firm—Oblon, Spivak, McClelland, Maier & Neustadt, P.C.

(57) ABSTRACT

A solution-receiving plate having solution-passing holes for passing a developer solution therethrough toward the back side of the plate is provided. Respective surfaces of the solution-receiving plate and a substrate are at the same height, and the solution-receiving plate is placed on the front-end side of the substrate and separated slightly from the front end of the substrate. A supply nozzle is moved to apply a developer solution. Accordingly, when the developer solution extended continuously between the perimeter of the substrate and the supply nozzle is severed, the severed developer solution is prevented from returning to the developer solution already spread over the substrate and thus flow and waves are prevented from occurring in the developer solution spread on the surface of the substrate. A resist pattern with a highly uniform line width is thus produced.

14 Claims, 14 Drawing Sheets

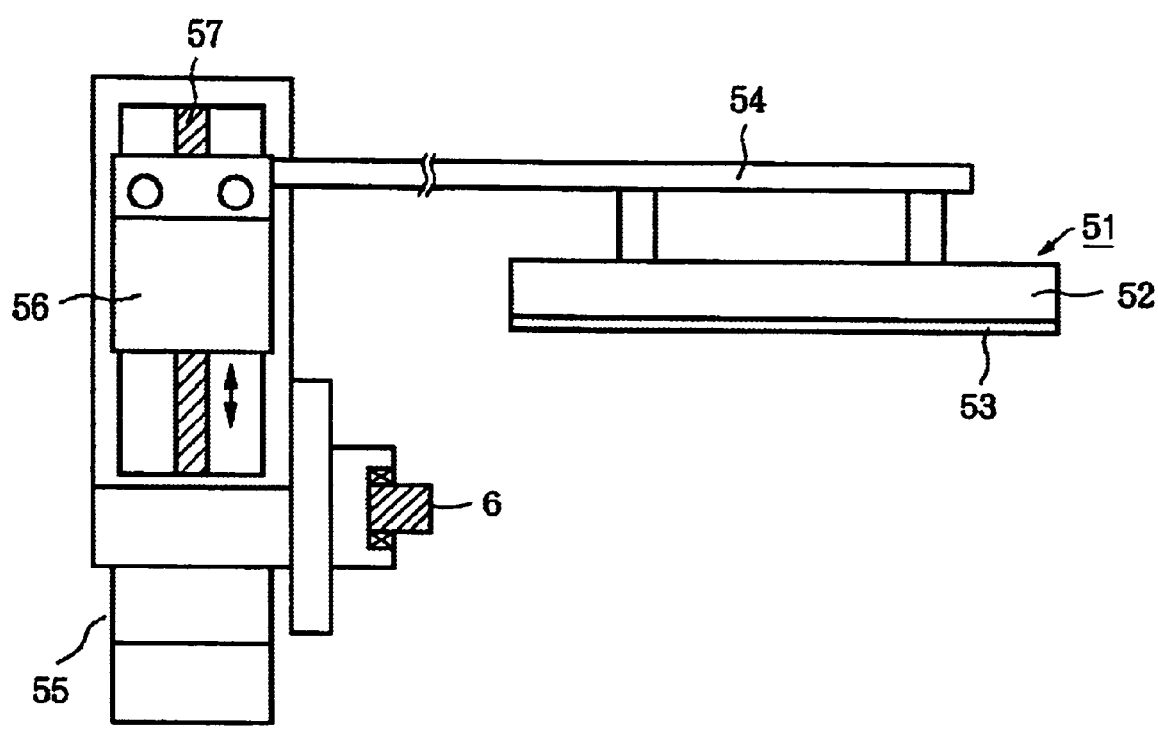

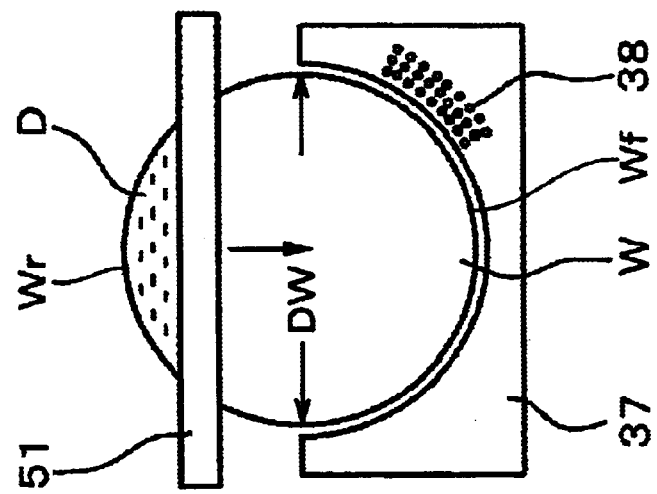
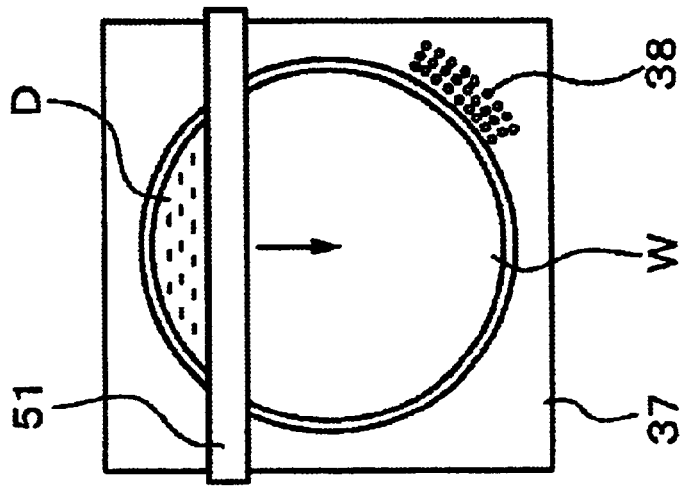
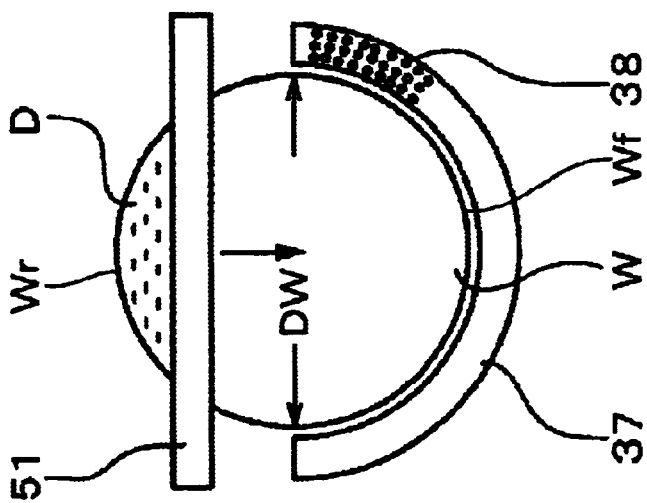

APPARATUS AND METHOD FOR DEVELOPMENT

BACKGROUND OF THE INVENTION

1. Field of the Invention

The present invention relates to an apparatus and a method for performing a developing procedure by supplying a developer solution to a surface of a substrate with photoresist being applied thereto and exposed to light.

2. Description of the Background Art

In a photolithography step which is one of the steps of manufacturing semiconductors, photoresist is applied onto a thin film formed on a surface of a semiconductor wafer (hereinafter wafer W) for example, the photoresist is exposed to light with a predetermined pattern, and then a mask pattern is formed through development. This photolithography procedure is generally performed by means of a system including an application/development unit for resist application and development and an exposure unit coupled to the application/development unit.

Referring to FIG. 14, according to a method of developing a wafer W which has been exposed, a nozzle 1 is used that has a discharge opening formed over a distance corresponding to the diameter of wafer W, and this nozzle 1 held above wafer W at a distance of approximately 1 mm is moved, with respect to a surface of wafer W held horizontally on a spin chuck 11, from the rear end of wafer W toward the front end thereof, so that a developer solution 12 supplied from the discharge opening of nozzle 1 is spread over the surface of wafer W to form a liquid film of approximately 1 mm in thickness over the entire surface of wafer W.

The above-discussed method has to address the following problem. This problem arises from the fact that, after nozzle 1 moving toward the front end of wafer passes over the diameter part (the center) of circular wafer W while supplying developer solution 12, the length of the effective region of wafer W relative to the length of nozzle 1 decreases gradually. In this case, as viewed from a certain part of the perimeter of wafer W, nozzle 1 moves away from this certain part while discharging developer solution 12, and this discharged developer solution does not fall immediately below the discharge opening but drawn by and coupled to the liquid film (developer solution) which has already been spread on the surface of wafer W due to the surface tension. This is because of the low discharge pressure of nozzle 1, the discharge pressure corresponding approximately to the own weight of developer solution 12. As nozzle 1 moves further toward the front end of wafer W, the surface tension cannot keep drawing developer solution 12 being supplied from the discharge opening, and consequently, the developer solution is severed between a part of the developer solution having been applied to the surface of wafer W and another part of the developer solution not to be applied to the surface of wafer W. In other words, nozzle 1 moves while discharging the developer solution which is separated between a part of the discharge opening of nozzle 1 that does not face the surface of wafer W and the certain peripheral part of wafer W away from the part of the discharge opening. In the severed developer solution, a returning force is generated that causes the severed developer solution to be returned (drawn) to developer solution 12 already spread on the surface of wafer W. This returning force causes a flow of developer solution 12 from the peripheral region of wafer W toward the center thereof, for example. The returning force is particularly great at the front end of wafer W, the returning force generated when nozzle 1 is moving away from the surface of wafer W. At this time, the returning force could cause waves in the developer solution 12 spread over the surface of wafer W. As a result, the uniformity of the line width accuracy of a mask pattern obtained after the development deteriorates, which has been found by the inventors of the present invention.

Referring to FIG. 15, according to a method devised for solving the above-discussed problem, a knife ring 13 is provided on the perimeter of wafer W to suitably sever the developer solution at the perimeter of wafer W. However, because of the low discharge pressure of developer solution 12 supplied from nozzle 1 that corresponds approximately to the own weight of the developer, the surface tension of the developer solution could work on the solution-severing face of knife ring 13 to hinder the developer solution from being appropriately severed.

SUMMARY OF THE INVENTION

The present invention has been made in consideration of the above-described circumstances. One object of the present invention is to provide a technique, in a development process for a substrate having undergone exposure, of allowing a developer solution to be applied onto a surface of the substrate without causing flow and waves in the developer solution spread over the surface of the substrate, thereby producing a mask pattern with a highly uniform line width.

According to the present invention, a developing apparatus is used for developing a substrate, with photoresist applied onto a surface of the substrate and exposed. The developing apparatus includes a substrate-holding unit holding the substrate in a horizontal state, a supply nozzle supplying a developer solution to the substrate, the supply nozzle having a discharge opening formed over a distance almost equal to or longer than the width of an effective region of the substrate, a moving mechanism moving the supply nozzle from a rear end of the substrate toward a front end of the substrate, and a solution-receiving plate having solution-passing holes for passing the developer solution therethrough toward the back of the solution-receiving plate, the solution-receiving plate being provided at least on the front-end side of the substrate and separated by a slight distance from the front end of the substrate, and the solution-receiving plate and the surface of the substrate being at the same height or the solution-receiving plate being at a height slightly lower than that of the surface of the substrate. The substrate is a semiconductor wafer for example and the solution-receiving plate is provided along a front half of the perimeter of the semiconductor wafer, the front half of the perimeter extending from one end of a diameter of the wafer that is in parallel with the supply nozzle to the other end of the diameter through the front end of the wafer. The developing apparatus further includes a cup surrounding, for example, the substrate held on the substrate-holding unit and freely moving up/down, and the solution-receiving plate is provided on an upper end of the cup. The substrate is separated from the solution-receiving plate by a distance of 0.5 mm to 3 mm. The solution-receiving plate is placed at a height lower than that of the surface of the substrate by 0.3 mm to 2.5 mm. The solution-receiving plate may be inclined downward with respect to the perimeter of the substrate.

Further, according to the present invention, a developing apparatus is used for developing a substrate, with photoresist applied onto a surface of the substrate and exposed. The developing apparatus includes a substrate-holding unit holding the substrate in a horizontal state, a supply nozzle supplying a developer solution to the substrate, the supply nozzle having a discharge opening formed over a distance almost equal to or longer than the width of an effective region of the substrate, and a moving mechanism moving the supply nozzle from a rear end of the substrate toward a front end of the substrate. The discharge opening is curved toward the front end of the substrate so that two lateral ends of the discharge opening are located back with respect to the center of the discharge opening.

Moreover, a developing apparatus is used for developing a substrate, with photoresist applied onto a surface of the substrate and exposed. The developing apparatus includes a substrate-holding unit holding the substrate in a horizontal state, a supply nozzle supplying a developer solution to the substrate, the supply nozzle having a discharge opening formed over a distance almost equal to or longer than the width of an effective region of the substrate, a moving mechanism moving the supply nozzle from a rear end of the substrate toward a front end of the substrate, and airflow generating means for generating an airflow over the surface of the substrate to prevent a flow from being produced in the developer solution on the substrate. The airflow generating means has air-discharge holes arranged along the perimeter of the substrate, and the airflow generating means is provided to freely move up/down.

When the developer solution is discharged from the supply nozzle to be applied onto the surface of the substrate, a part of the developer solution extended continuously from the supply nozzle to the perimeter of the substrate by the action of the surface tension is severed and then the severed developer solution returns to the developer solution already spread over the substrate. According to the present invention, the developer solution is applied to the surface of the substrate without causing the returning of the developer solution. Then, no flow and wave occur in the developer solution spread over the surface of the substrate and accordingly a mask pattern of a highly uniform line width is obtained.

According to the present invention, a developing method is used for developing a substrate, with photoresist applied onto a surface of the substrate and exposed. The developing method includes the steps of holding the substrate in a horizontal state on a substrate-holding unit, placing, a solution-receiving plate having solution-passing holes, at least on a front-end side of the substrate with respect to the direction in which a supply nozzle is moved, the solution-receiving plate being separated by a slight distance from the front end of the substrate, and the solution-receiving plate and the surface of the substrate being at the same height or the solution-receiving plate being at a height slightly lower than that of the surface of the substrate, and thereafter moving the supply nozzle for supplying a developer solution to the substrate, the supply nozzle having a discharge opening formed over a distance almost equal to or longer than the width of an effective region of the substrate, the supply nozzle being moved from a rear end of the substrate toward the front end of the substrate to apply the developer solution to the surface of the substrate while a part of the developer solution discharged from a part of the discharge opening located outside the substrate is passed through the solution-passing holes of the solution-receiving plate toward the back of the solution-receiving plate. The solution-receiving plate is provided on an upper end of a cup surrounding the substrate held on the substrate-holding unit and freely moving up/down. The substrate is separated from the solution-receiving plate by a distance of 0.5 mm to 3 mm. The solution-receiving plate is placed at a height lower than that of the surface of the substrate by 0.3 mm to 2.5 mm. The solution-receiving plate may be inclined downward with respect to the perimeter of the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a side view of a developer supply unit of the developing apparatus according to the present invention.

FIGS. 6A to 6C illustrate another embodiment of the developing apparatus according to the present invention.

DESCRIPTION OF THE PREFERRED EMBODIMENTS

Figure 1:
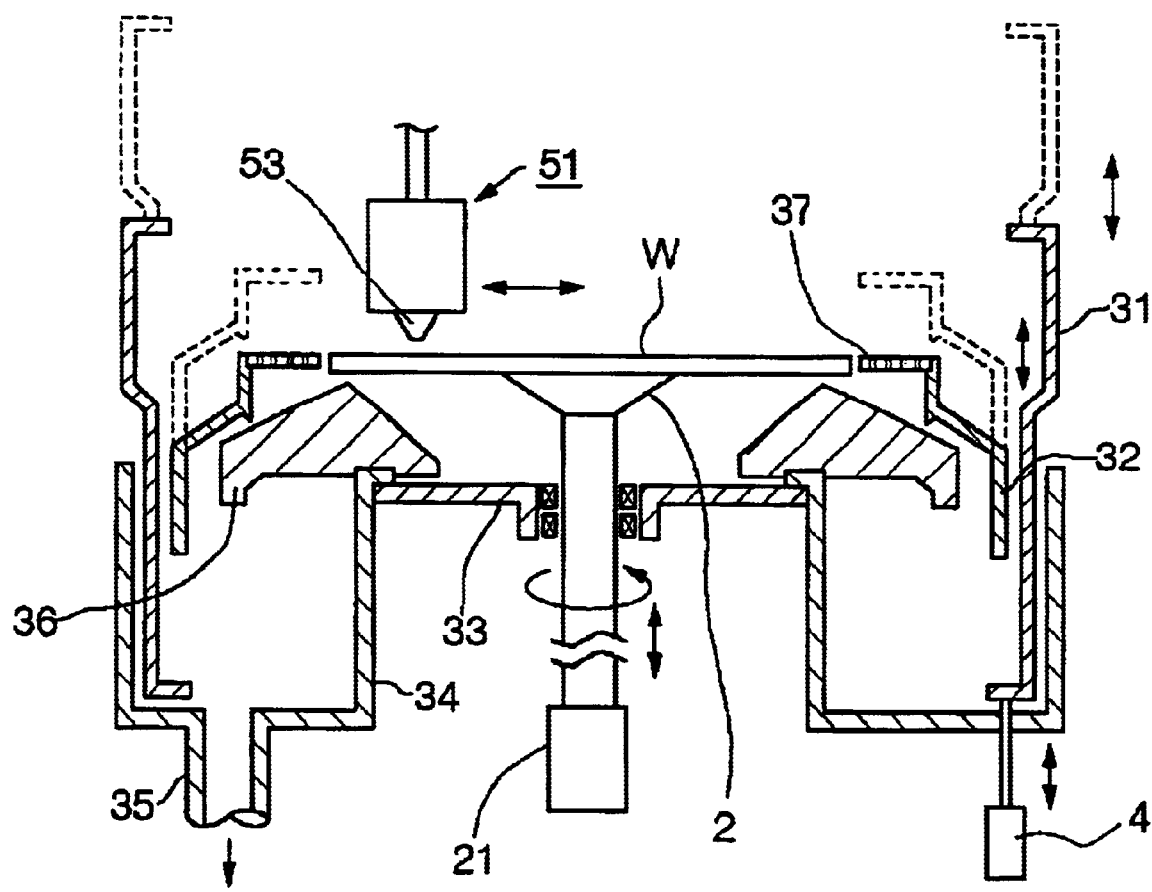
FIG. 1 is a cross sectional view of a developing apparatus according to one embodiment of the present invention.

One embodiment of a developing apparatus according to the present invention is now described in connection with FIGS. 1-3 that schematically show the developing apparatus. The developing apparatus includes a spin check 2 serving as a substrate-holding unit which holds a wafer W in the horizontal state by sucking for example the center of the back side of a wafer W. Spin chuck 2 has a main axis connected to a driving unit 21 to rotate and move up/down. A rectangular outer cup 31 and an annular inner cup 32 are provided for preventing mist of a developer solution and a rinsing solution from flying off to the outside in the development process. These cups are provided to form a processing space surrounding wafer W. The bottom surface of this processing space is constituted of a circular plate 33 and a solution-receiving unit 34 placed around circular plate 33 for receiving the developer solution and the rinsing solution. The developer and rinsing solutions are discharged from the apparatus through a discharge opening 35 provided on the bottom of solution-receiving unit 34. On the perimeter of circular plate 33, a ring-shaped unit 36 with an inverted V-shaped cross section is provided, and the topmost end of ring-shaped unit 36 is located close to the back side of wafer W. In addition, outer cup 31 is allowed to move up/down by an up-and-down mechanism 4 and inner cup 32 is allowed to move up/down in relation to outer cup 31.

On inner cup 32, a ring-shaped solution-receiving plate 37 of 30 mm in the ring width and 1.5 mm in the thickness for example is provided to surround the perimeter of wafer W held on spin chuck 2. The inner circular boundary of solution-receiving plate 37 is placed to leave an interval of 0.5 to 3 mm between the perimeter of wafer W and the inner circular perimeter of solution-receiving plate 37 when positioned around wafer W. A structure for mounting this solution-receiving plate 37 preferably allows solution-receiving plate 37 to be engaged with a step formed on the internal edge of inner cup 32 for example and accordingly held on inner cup 32, and accordingly solution-receiving plate 37 is replaceable. Moreover, solution-receiving plate 37 has solution-passing holes 38 of 3 mm in diameter for example that are arranged, with 5 mm pitches for example, in a zigzag or regular manner. Solution-receiving plate 37 is made of a material selected from SUS (Japanese Industrial Standards), ceramic and resin materials for example. The present invention is not limited to this arrangement of solution-passing holes 38. For example, slit-shaped openings may concentrically be formed or solution-receiving plate 37 may be of a mesh-like member.

A supply nozzle 51 for supplying a developer solution onto the surface of wafer W has a discharge opening 53 of a length almost equal to or longer than the width of the effective region of wafer W, and discharge opening 53 is provided on the bottom side and in the longitudinal direction of a slim and rectangular nozzle body 52 having therein a channel for the developer solution. Discharge opening 53 may be structured to have many discharge holes arranged in a line along the length equal to the diameter of wafer W for example. Alternatively, discharge opening 53 may be structured to have a slit-shaped opening of a length equal to the diameter of wafer W. Supply nozzle 51 is connected to a moving unit 56 of a first moving mechanism 55 via an arm unit 54. The first moving mechanism 55 moves horizontally along a guide rail 6, and supply nozzle 51 is structured to be movable horizontally from the front end toward the rear end of wafer W. Moreover, the first moving mechanism 55 is structured to have for example a ball screw mechanism 57 to allow supply nozzle 51 to move up/down.

A cleaning nozzle 71 for supplying a rinsing solution, pure water for example, to the surface of wafer W in a cleaning process after the development is connected to a second moving mechanism 72. Cleaning nozzle 71 is structured to be movable horizontally along guide rail 6 with a discharge opening for the rinsing solution positioned above the center of wafer W. Driving unit 21, up-and-down mechanism 4, the first moving mechanism 55 and the second moving mechanism 72 are connected to respective control units controlling the operation of these units so that the units move in relation to each other. For example, according to the up-and-down movement of spin chuck 2 caused by driving unit 21, the first moving unit 55 causes the developer solution to be supplied.

A development process by means of the developing apparatus discussed above is now described. First, spin chuck 2 moves up beyond the top of outer cup 31 to receive from a transport arm (not shown) a wafer W with photoresist applied thereto and exposed to light in the preceding process. Then, spin chuck 2 moves down while sucking the central part of wafer W and is placed at a position appropriate for developing wafer W, for example, at the position indicated by the solid line in FIG. 1. In this case, spin chuck 2 is placed to leave a distance for example of 0.5–3 mm between the inner circular perimeter of solution-receiving plate 37 and the perimeter of wafer W and to position respective surfaces of solution-receiving plate 37 and wafer W at the same height or position solution-receiving plate 37 slightly lower in position than wafer W. Here, preferably solution-receiving plate 37 (surface of solution-receiving plate 37) is lower than wafer W (surface of wafer W) by 0.3–2.5 mm. Subsequently, supply nozzle 51 is moved horizontally to the starting position between outer cup 31 and the perimeter of wafer W. Further, supply nozzle 51 is moved down to a position appropriate for supplying the developer solution to wafer W, for example, positioned with the leading end of discharge opening 53 higher than the surface of wafer W by approximately 1 mm.

Figure 4A:
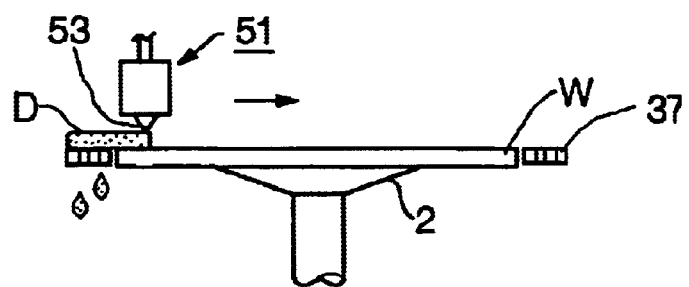
FIGS. 4A to 4E illustrate respective steps of a development process of the developing apparatus according to the present invention.
Figure 4B:
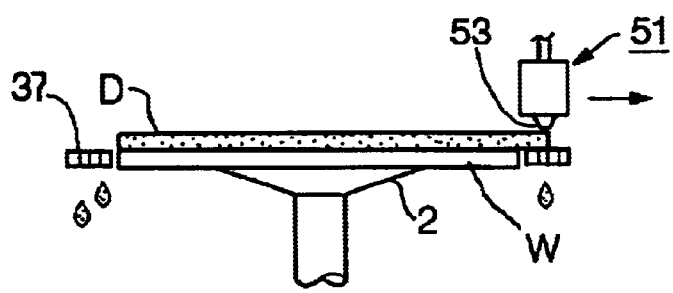

Referring to FIGS. 4A and 4B, developer solution D is discharged from discharge opening 53 of supply nozzle 51 while supply nozzle 51 is moved at a speed of 100 mm/sec for example from the rear end of wafer W to pass the place above the center of wafer W and is further moved toward the front end of wafer W. The developer solution D is thus supplied to wafer W and solution-receiving plate 37. At this time, developer solution D is spread on the leading end surface of supply nozzle 51 and accordingly spread to form a liquid film of 1 mm in thickness on the surface of wafer W. On the other hand, developer solution D supplied to solution-receiving plate 37 flows downward through solution-passing holes 38 and discharged from discharge opening 35 via solution-receiving unit 34.

Figure 4C:
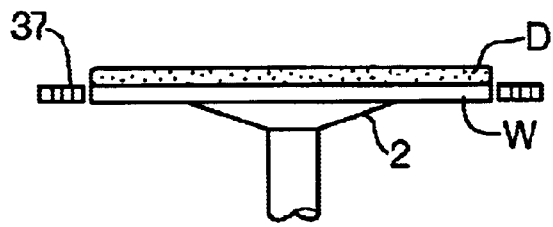
Figure 4D:
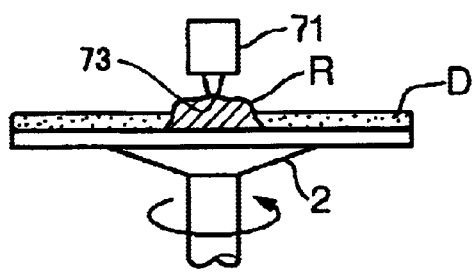
Figure 4E:
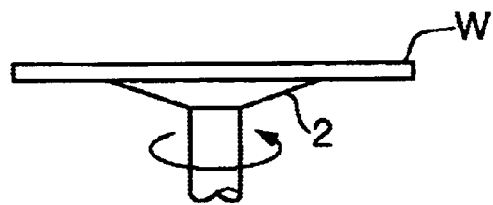

After developer solution D is spread, supply nozzle 51 is withdrawn and the state as shown in FIG. 4C is kept for 55 seconds for example and, through stationary development, dissoluble parts of the photoresist on the surface of wafer W are dissolved in developer solution D to form a mask pattern. Outer cup 31 is thereafter moved upward and, in relation to the movement of outer cup 31, inner cup 32 and solution-receiving plate 37 are moved up so that the inclined plane of inner cup 32 is positioned on the side of the perimeter of wafer W. Then, cleaning nozzle 71 is moved with discharge opening 73 for rinsing solution R located above the center of wafer W. Accordingly, rinsing solution R is supplied as shown in FIG. 4D from cleaning nozzle 71 to the center of wafer W, while spin chuck 2 is rotated to replace developer solution D on the surface of wafer W with rinsing solution R by the centrifugal force which removes the developer from the central part of wafer W toward the perimeter thereof. Developer D is thus washed away. Further, as shown in FIG. 4E, spin chuck 2 is rotated to spin-dry wafer W and thus the development process is completed. At this time, developer solution D and rinsing solution R are discharged from discharge opening 35 via solution-receiving unit 34.

Figure 5A:
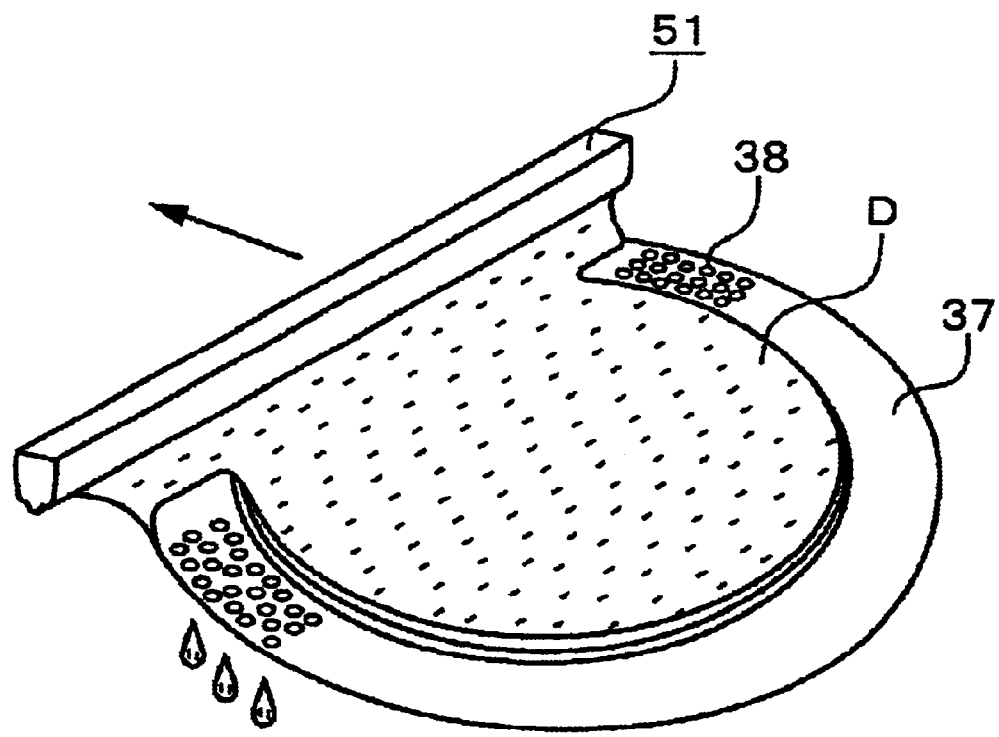
FIGS. 5A and 5B illustrate a manner of supplying a developer solution by the developing apparatus according to the present invention.
Figure 5B:
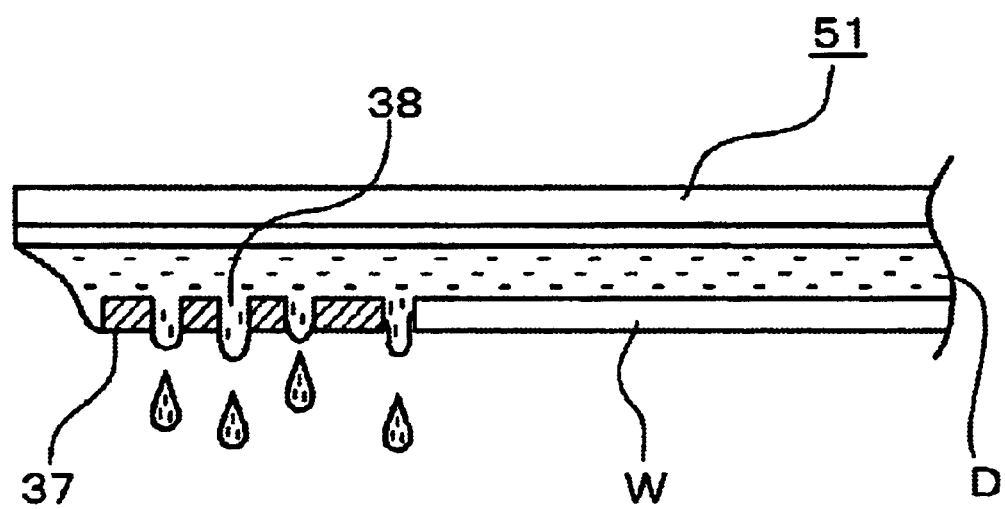

As schematically shown in FIGS. 5A and 5B, according to the above-discussed embodiment, supply nozzle 51 is moved to pass the diameter part of wafer W which is in parallel with supply nozzle 51 and further moved toward the front end of wafer W. At this time, developer solution D located above and beyond the perimeter of wafer W is drawn outward according to the movement of discharge opening 53. Developer solution D then reaches solution-receiving plate 37, without being severed, to temporarily fill the holes of the solution-receiving plate 37. This developer solution D thereafter falls from the holes due to the own weight of the developer. As developer solution D falls, developer solution D on wafer W is returned/drawn toward the center of the wafer to a slight degree. However, such a great degree of returning of the developer as found when no solution-receiving plate 37 is provided does not occur. Therefore, developer solution D on wafer W is in the steady state. Consequently, developer D on the surface of wafer W is prevented from flowing and waving. The inventors of the present invention have found that the uniformity of the line width of the mask pattern obtained through the development is improved. In addition, if solution-receiving plate 37 is positioned lower than the surface of wafer W, slight returning of developer solution D filling the holes and then falling therethrough is avoided. Even if particles are attached to the developer solution on solution-receiving plate 37, the particles are effectively prevented from being drawn toward wafer W due to the slight returning of the developer. It is noted that if solution-receiving plate 37 is placed lower than the surface of wafer W by more than 2.5 mm, developer solution D on the perimeter of wafer W could flow, when developer solution D fills the holes, toward solution-receiving plate 37.

Another embodiment of the present invention is described below. The shape of solution-receiving plate 37 is not limited to the ring as described above. For example, as shown in FIG. 6A, a solution-receiving plate 37 in the shape of a horseshoe may be provided at the position corresponding to the section of wafer W from the diameter part to the front end of wafer W. Alternatively, as shown in FIG. 6B, a rectangular solution-receiving plate 37 may be provided that has an opening slightly greater than and similar in shape to wafer W. Alternatively, as shown in FIG. 6C, a rectangular solution-receiving plate 37 may be provided at the position corresponding to the section of wafer W from the diameter part to the front perimeter of wafer W. In addition, solution-receiving plate 37 may be inclined so that the inner perimeter of the plate is higher and the plate is located gradually lower toward the outer perimeter. The structure as discussed above reduces the returning force of the developer solution to prevent developer D spread on wafer W from flowing and waving. Solution-receiving plates 37 as shown in FIGS. 6A and 6C are each provided to surround a part of the perimeter of wafer W extending from the diameter DW in parallel with supply nozzle 51 to the front end Wf of wafer W. Supply nozzle 51 thus moves from the rear end Wr of wafer W toward the front end Wf thereof.

Figure 7:
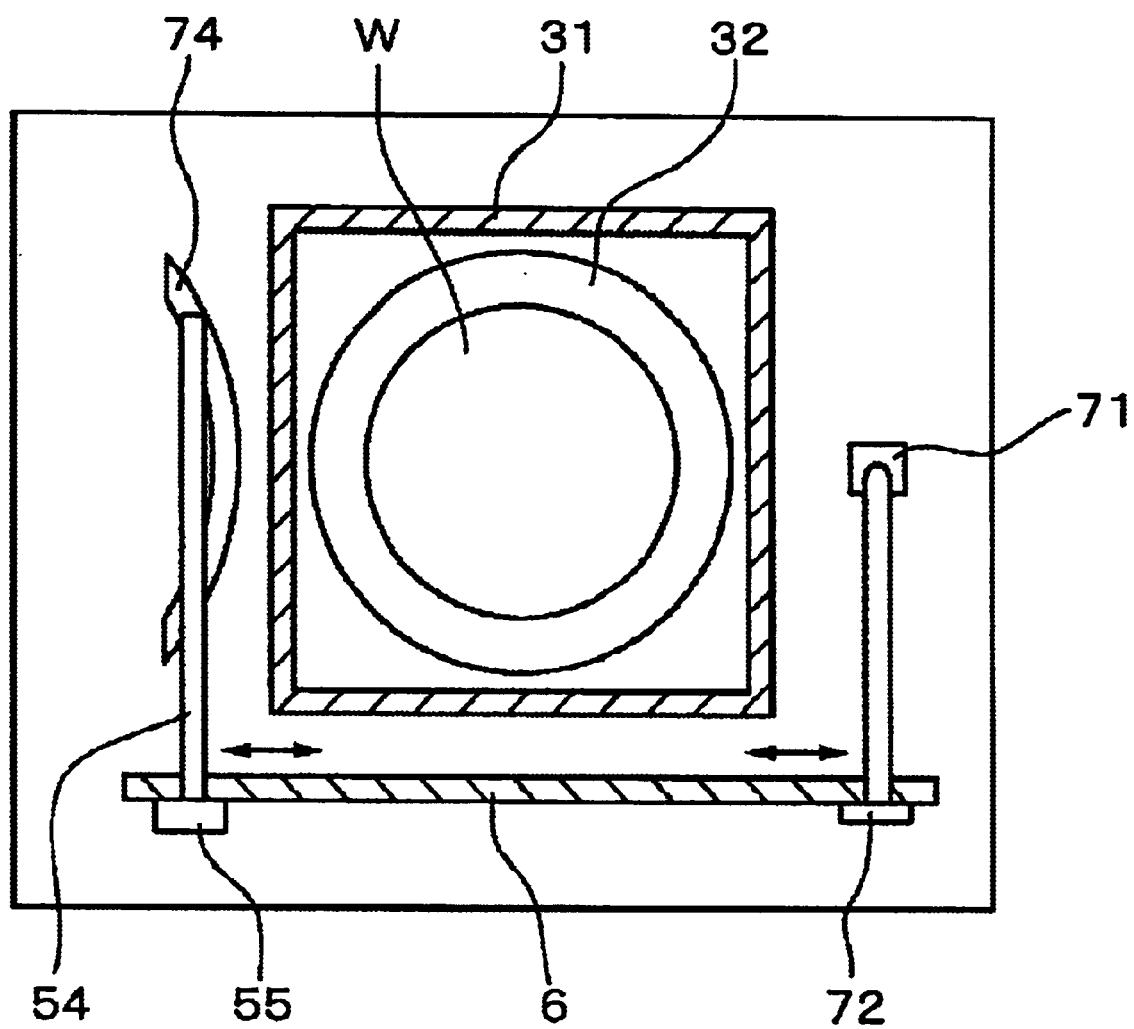
FIG. 7 is a plan view of a developing apparatus according to still another embodiment of the present invention.
Figure 8:
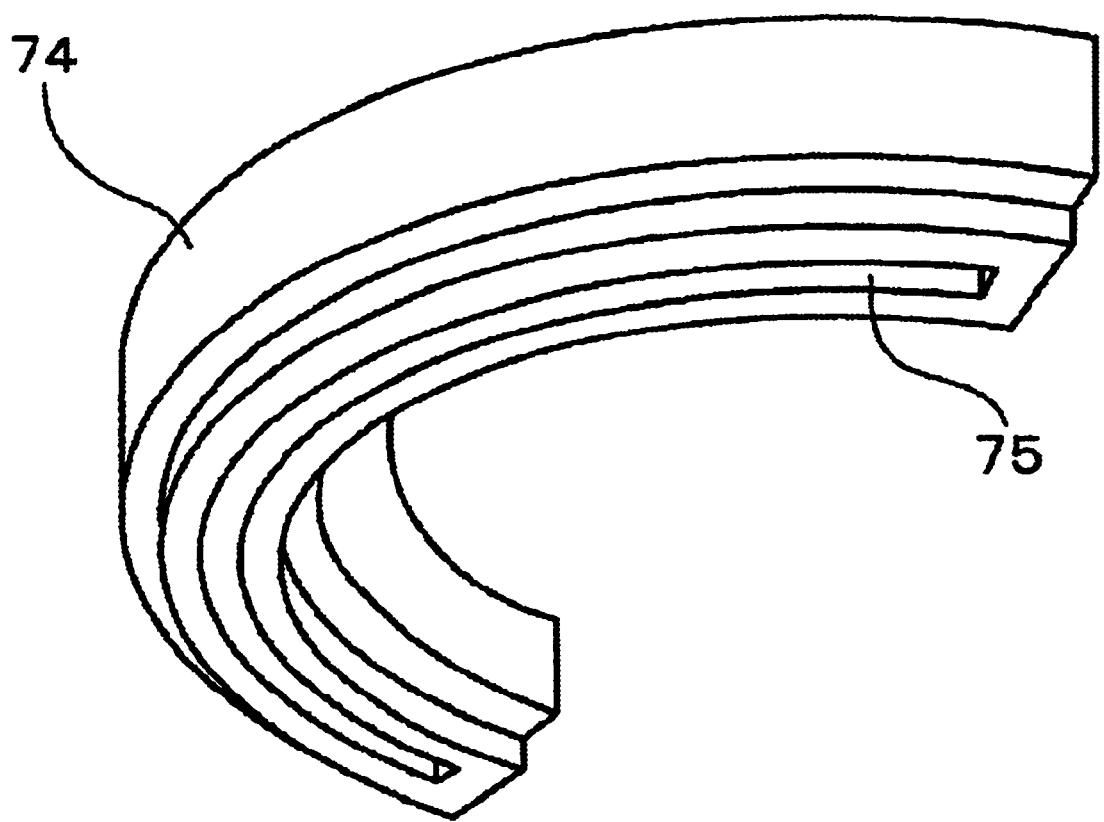
FIG. 8 is a perspective view of a supply nozzle of the developing apparatus according to that still another embodiment of the present invention.

Still another embodiment of the present invention is described below in connection with FIGS. 7 and 8. According to this embodiment, no solution-receiving plate 37 is provided. Instead, a discharge opening 75 of a supply nozzle 74 is curved in the direction of movement of the supply nozzle 74. For example, discharge opening 75 is shaped into an arc having the same curvature as that of the perimeter (circumference) of wafer W. Other components that are the same as corresponding components of the above-discussed embodiments are not described here.

Figure 9A:
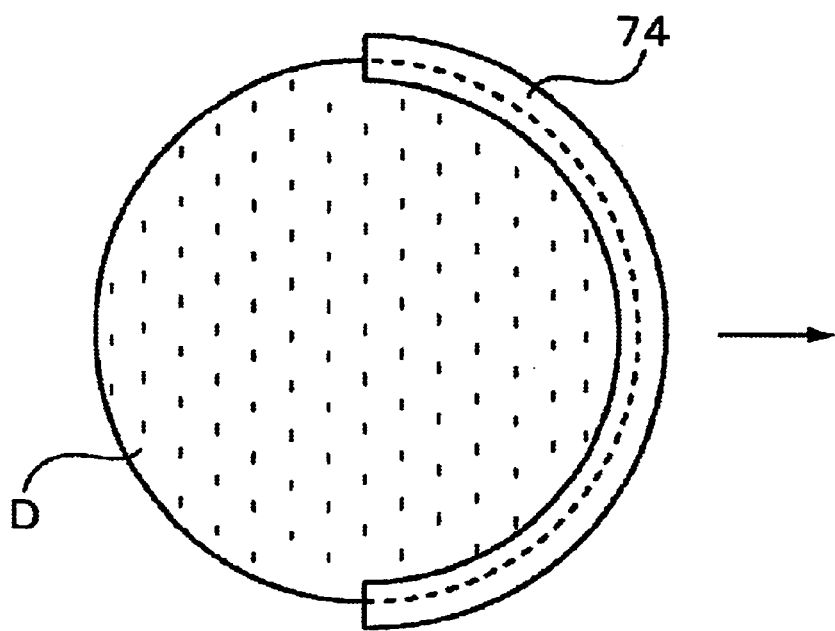
FIGS. 9A and 9B illustrate the way in which a developer solution is supplied in the developing apparatus according to still another embodiment of the present invention.

With such a structure of this embodiment, supply nozzle 74 moves while discharging a developer solution D, reaches the position as shown in FIG. 9A where discharge opening 75 matches the front half of the perimeter of wafer W as viewed from the above, and then moves away from the perimeter of wafer W. At this time, any part of discharge opening 75 is separated from wafer W by the same distance. Therefore, developer solution D does not severed at a point but severed along a line corresponding to the perimeter of wafer W. Thus, the returning force of the severed developer solution toward the developer solution spread on the surface of wafer W is distributed and accordingly weakened effectively as accomplished by the embodiments discussed above. Here, supply of developer solution D may be stopped when discharge opening 75 matches the front half of the perimeter of wafer W in order to further weaken the returning force of the developer solution.

Figure 9B:
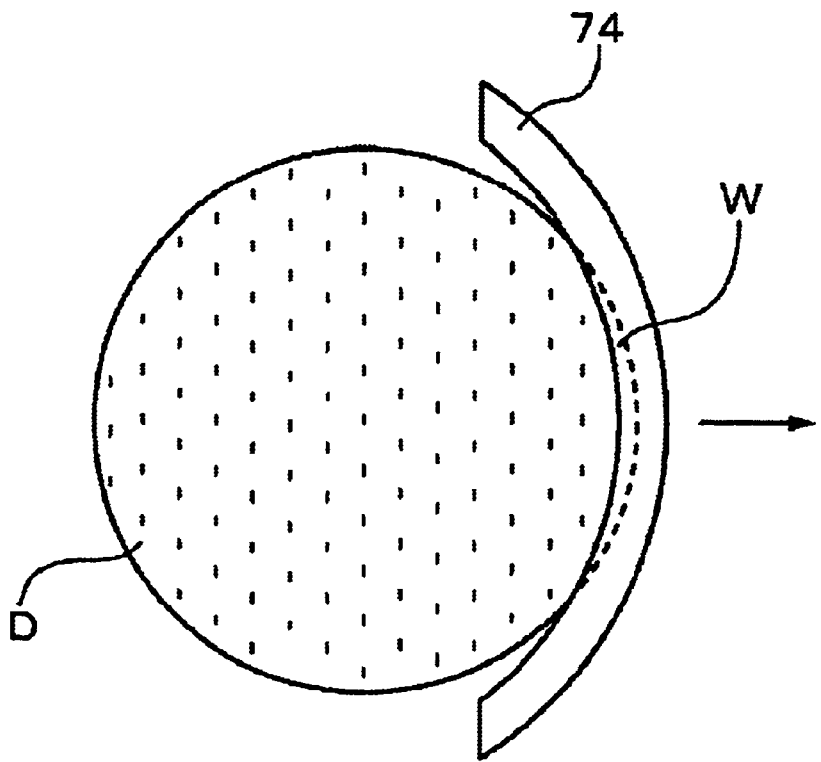

The curvature of discharge opening 75 is not limited to that of the perimeter (circumference) of wafer W, and may be set in the range from $\pi d$ to $\pi 2d$ where d is the diameter d of wafer W. With such a structure as shown in FIG. 9B for example, discharge opening 75 partially matches the perimeter of wafer W when discharge opening 75 is passing over the front end of wafer W. Accordingly, developer solution D is not severed at a point but severed along a line of a certain length along the perimeter of wafer W. In this way, the returning force of the severed developer solution toward the developer solution spread on the surface of wafer W is distributed and thus weakened effectively as accomplished by the above-discussed embodiments.

Figure 10A:
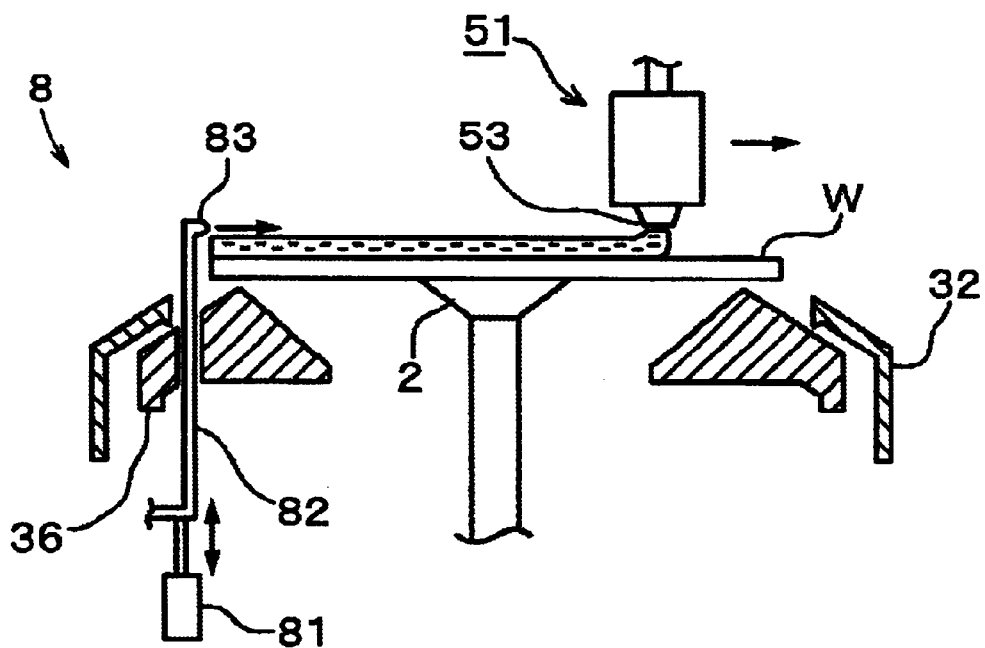
FIGS. 10A and 10B illustrate a developing apparatus according to a further embodiment of the present invention.
Figure 10B:
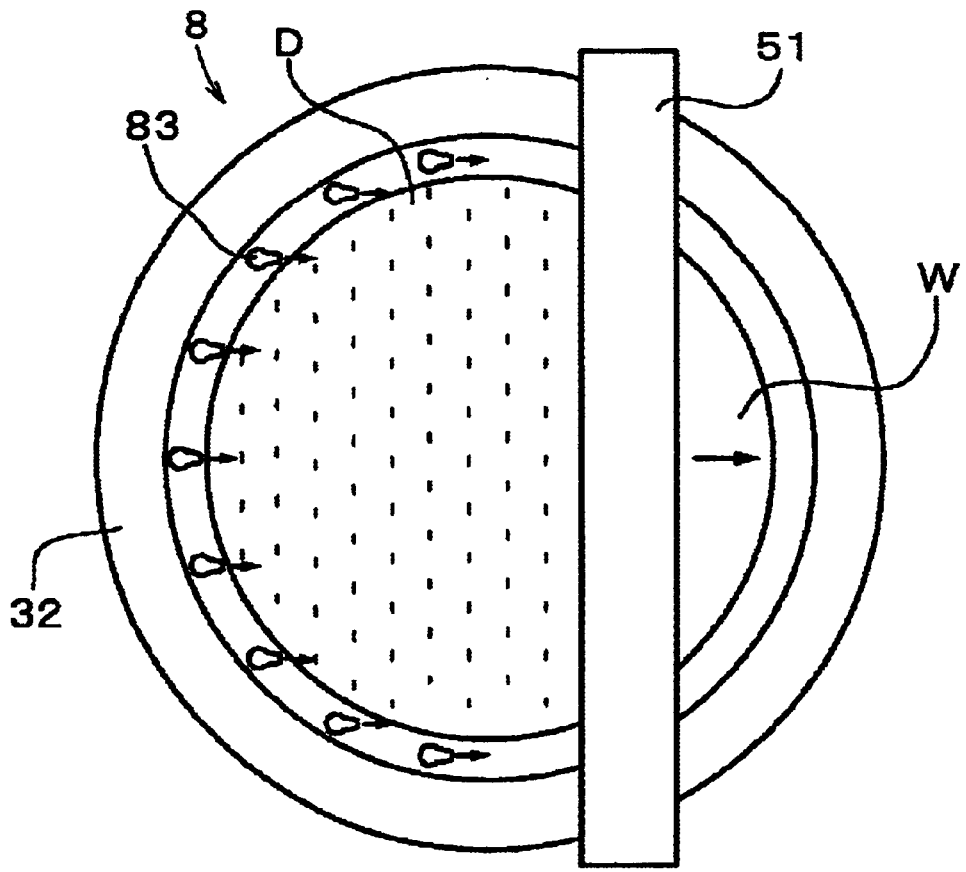

According to a further embodiment of the present invention, airflow generating means 8 may be provided for generating an airflow passing over the surface of wafer W from the rear end on the perimeter of wafer W toward the front end thereof. For example, as shown in FIGS. 10A and 10B, airflow generating means 8 is provided between wafer W and inner cup 32 along the rear half of the perimeter of wafer W. Airflow generating means 8 is structured to have many air discharge tubes 82 that are moved up/down freely by an up-and-down mechanism 81. When developer solution D is spread, respective air-discharge holes 83 of air discharge tubes 82 are set at a height of 2 mm for example with respect to the surface of wafer W to supply gas, for example, nitrogen gas in the direction of movement of supply nozzle 51 for example. The same components of this embodiment that are the same as corresponding components respectively of the above-described embodiments are not described here. Airflow generating means 8 includes up-and-down mechanism 81, air discharge tubes 82 and air-discharge holes 83.

With the above-discussed structure, when developer solution D is discharged from supply nozzle 51 moving over the center of wafer W toward the front end thereof, discharged developer solution D continuously extended between wafer W and discharge opening 53 of supply nozzle 51 by the action of the surface tension is severed to cause the returning force toward the developer solution on the surface of wafer W, and this returning force is reduced or weakened by the wind pressure of the gas supplied by airflow generating means 8. In this way, flow and waves in developer solution D spread over wafer W are avoided to obtain a highly uniform mask pattern after development.

Airflow generating means 8 is not limited to the above-described structure. For example, air discharge tubes 82 may be arranged at respective positions to generate an airflow in the opposite direction to the direction in which the returning force of the developer solution is caused, the direction of the returning force being found in advance through experiments. Further, a suction mechanism (not shown) may be connected to air discharge tubes 82 to generate an airflow by the suction. With such a structure, the returning force of the developer solution is weakened by the wind pressure of the gas effectively as achieved by the embodiments described above.

Figure 11A:
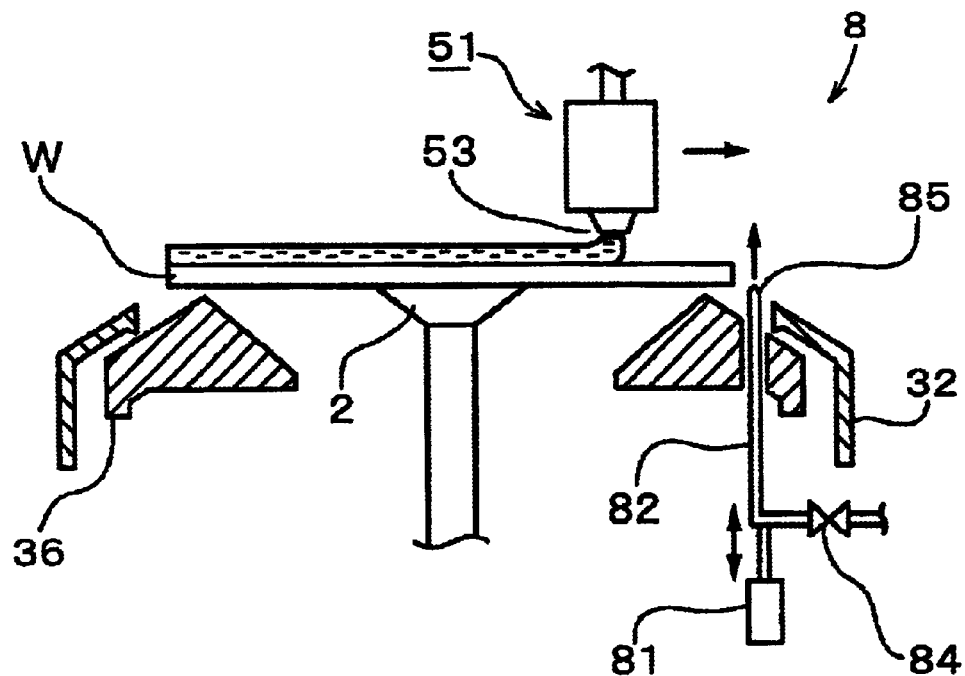
FIGS. 11A and 11B illustrate a developing apparatus according to a further embodiment of the present invention.
Figure 11B:
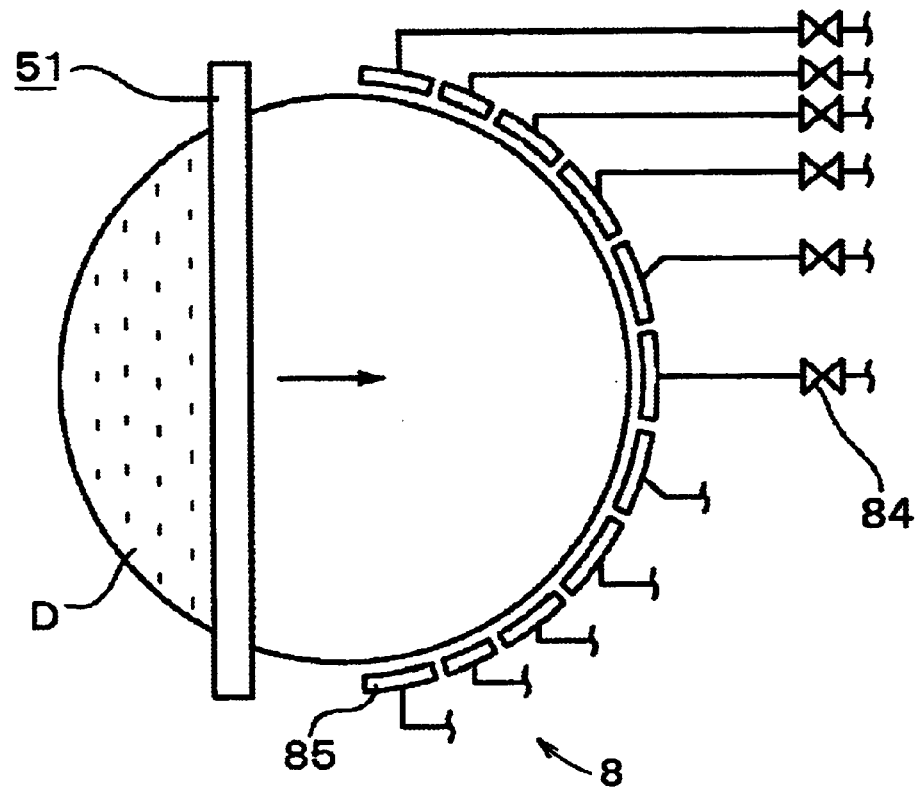

Further, airflow generating means 8 may include air-discharge holes 85 and automatic valves 84. For example, air discharge tubes 82 connected respectively to automatic valves 84 that are freely opened/closed are provided along the front half of the perimeter of wafer W as shown in FIGS. 11A and 11B, and respective leading ends of the air discharge tubes are formed as respective air discharge openings in the shape of short arcs. For example, through sequential control, automatic valves 84 may be opened/closed in accordance with the timing at which supply nozzle 51 passes, to successively discharge purge gases upward from respective air discharge openings 85. With such a structure, before developer solution D extended continuously between the perimeter of wafer W and discharge opening 53 of supply nozzle 51 is drawn to be severed, the developer solution is severed successively by the purge gases. Accordingly, the returning force of the developer solution is weakened to effectively prevent flow and waves in developer solution D spread over wafer W, as accomplished by the above-discussed embodiments.

Solution-receiving plate 37, supply nozzle 74 in the shape of the arc and airflow generating means 8 may be combined with each other in the embodiments described above. For example, solution-receiving plate 37 may be provided and the arc-shaped supply nozzle 74 may be used to spread the developer solution, or solution-receiving plate 37 and airflow generating means 8 may be combined, or the arc-shaped supply nozzle 74 and airflow generating means 8 may be combined. Alternatively, all of the solution-receiving plate 37, arc-shaped supply nozzle 74 and airflow generating means 8 may be provided.

Figure 12:
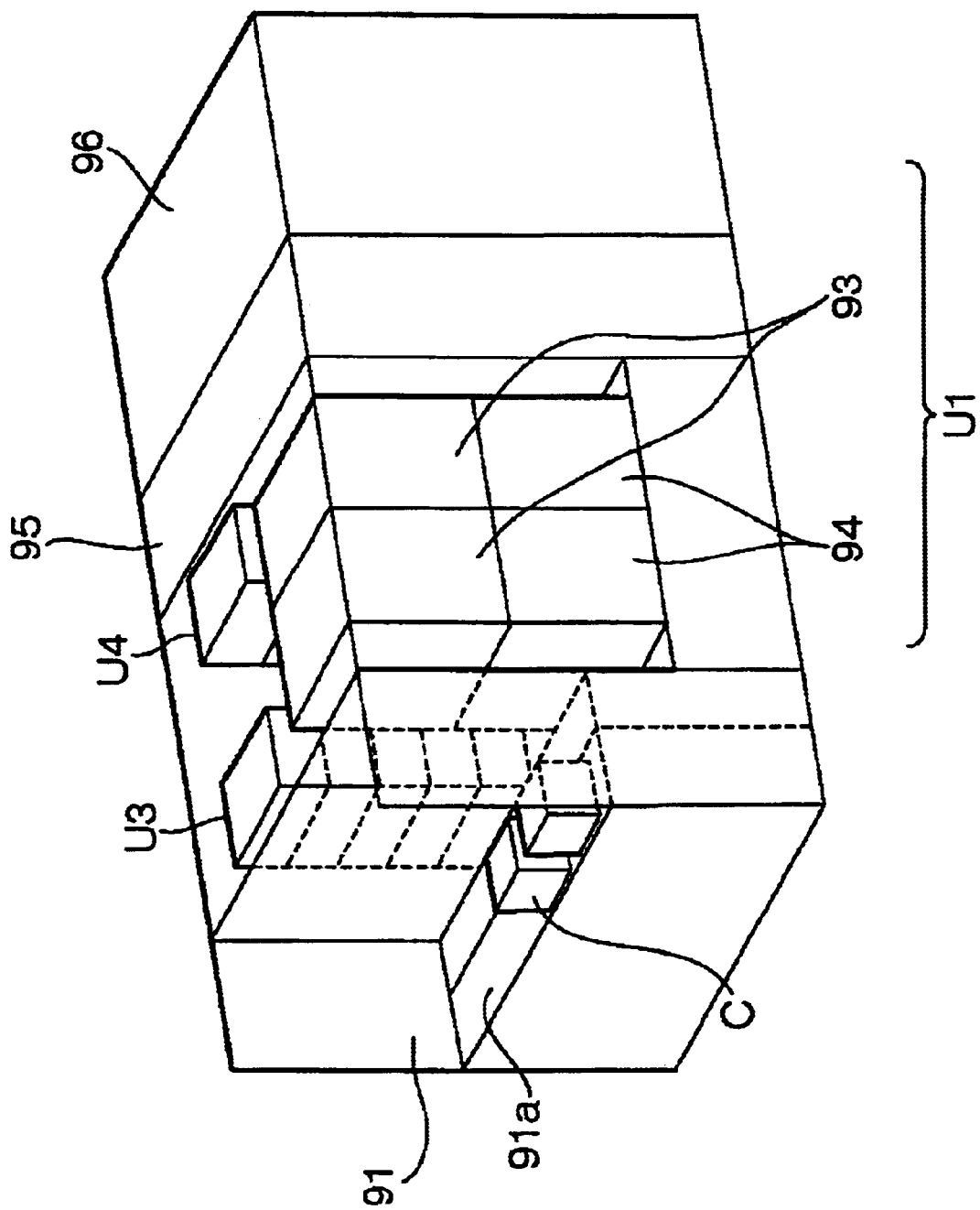
FIG. 12 is a perspective view of an exemplary application/development apparatus having the developing apparatus incorporated therein.
Figure 13:
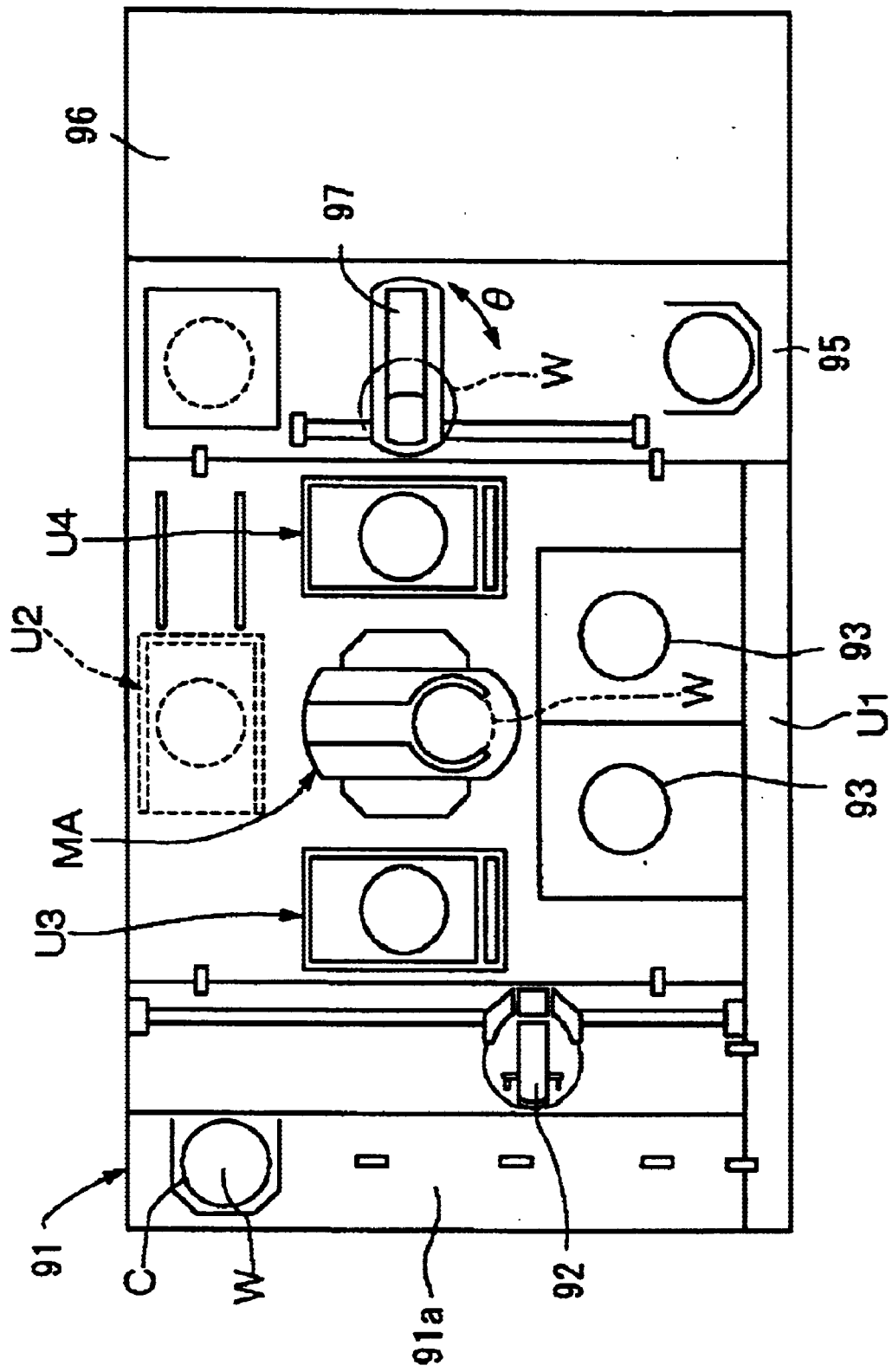
FIG. 13 is a plan view of the exemplary application/development apparatus having the developing apparatus incorporated therein.
Figure 14:
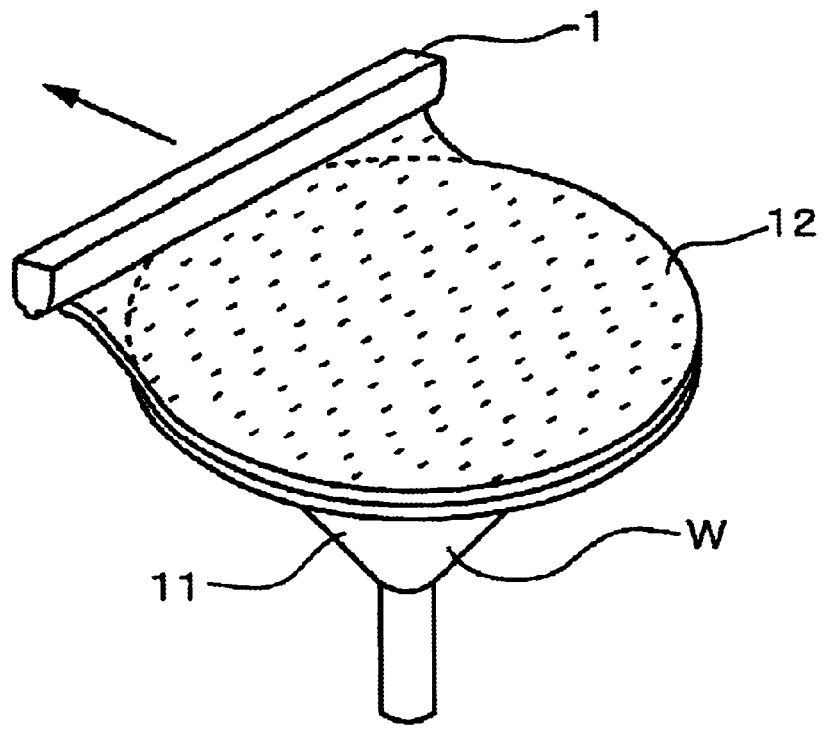
FIG. 14 illustrates a method of supplying a developer solution according to a conventional art.
Figure 15:
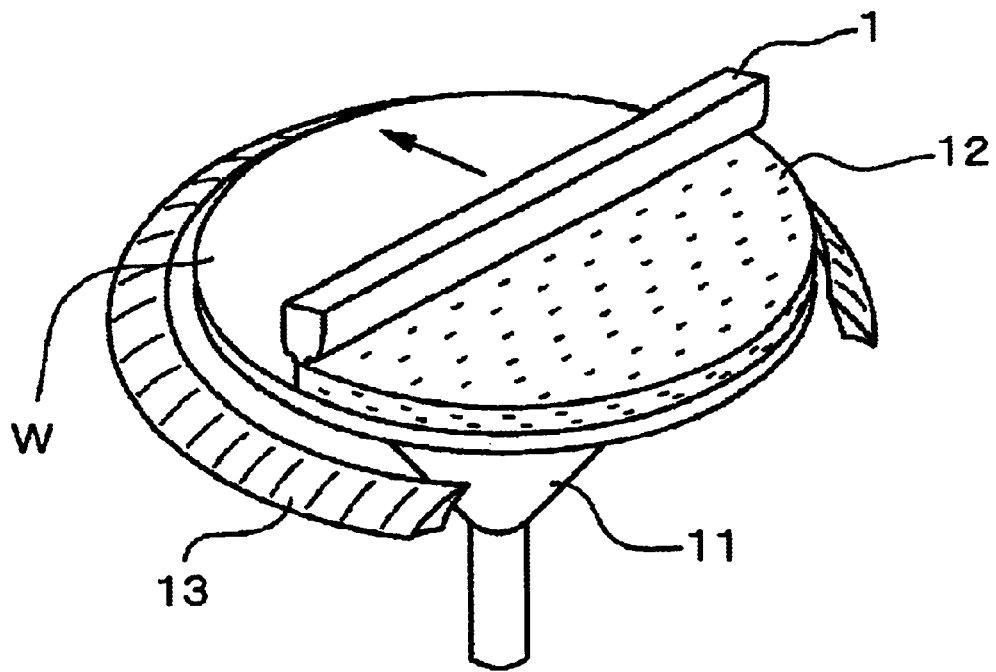
FIG. 15 illustrates another method of supplying a developer solution according to a conventional art.

An exemplary application/development apparatus is described in connection with FIGS. 12 and 13 that includes the above-described developing apparatus in a development unit. Referring to FIGS. 12 and 13, a cassette station 91 is provided for transporting a cassette C into/out of the apparatus, cassette C containing 25 wafers W for example. Cassette station 91 includes a table 91*a* for mounting cassette C thereon, and transfer means 92 for taking out wafer W from cassette C. As viewed inward from cassette station 91, an application/development unit U1 is located on the right side, and shelf units U2, U3 and U4 are located respectively on the left side, near side and far side, and the shelf units have heating/cooling units stacked on each other for example. Moreover, a transport arm MA is provided for passing/receiving wafer W between application/development unit U1 and shelf units U2, U3 and U4. For the sake of convenience, transfer means 92, unit U2 and transfer arm MA are not shown in FIG. 12.

Application/development unit U1 includes, for example, a development unit 93 having two developing apparatuses as described above and an application unit 94 placed under development unit 93 that has two application apparatuses. In addition to the heating and cooling units, a wafer-transfer unit and a dehydrating unit for example are arranged in the vertical direction in shelf units U2, U3 and U4.

Here, transport arm MA and application/development unit U1 are hereinafter referred to collectively as a process block. Then the process block is connected to an exposure block 96 through an interface unit 95. Interface unit 95 serves to convey wafer W between the process block and exposure block 96 by transfer means 97.

A wafer is passed in this apparatus as described below. First, wafer cassette C containing wafers W therein is provided from the outside and placed on table 91*a*, and a wafer W is taken out of the cassette C by transfer means 92 and conveyed to transport arm MA via a transfer table which is one of the shelves of heating/cooling unit U3 described above. Then, in a processing unit on one shelf of unit U3, wafer W is dehydrated, resist is then applied to wafer W in application unit 94 to form a resist film. Wafer W with the resist film applied thereon is heated in a heating unit and thereafter transported to a cooling unit of unit U4 which can pass/receive wafer W to/from transfer means 97 of interface unit 95. After wafer W is processed, wafer W is conveyed via interface unit 95 and transfer means 97 to the exposure apparatus 96 to undergo the exposure process through a mask having an appropriate pattern. The exposed wafer is received by transfer means 97 to be passed to wafer transport arm MA of the process block via a transfer unit of unit U4.

Figure 2:
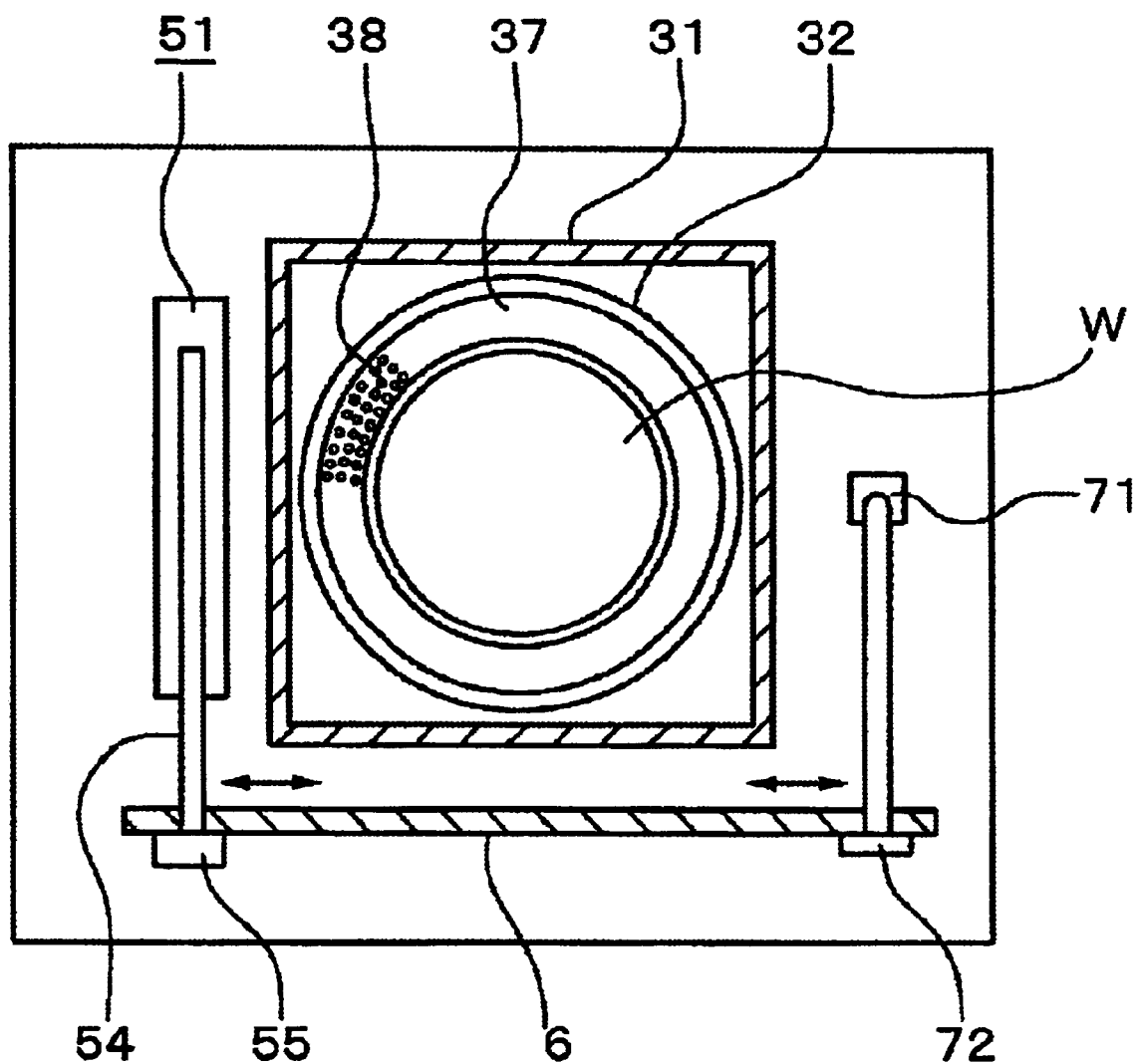
FIG. 2 is a plan view of the developing apparatus according to the embodiment of the present invention.

After this, wafer W is heated to a predetermined temperature in the heating unit and, after an appropriate time, wafer W is cooled to a predetermined temperature in the cooling unit, and then passed to development unit 93 having the apparatus for example shown in FIGS. 1–3. The wafer is accordingly developed to form a mask pattern of the resist. After a certain appropriate time, wafer W is returned into cassette C on table 91*a*. The present invention is applicable to any substrate except for those of semiconductor wafers, such as LCD substrates and reticle substrates to be used as photomasks.

As heretofore discussed, according to the present invention, when a substrate is developed that has photoresist applied to a surface of the substrate and exposed to light, a developer solution is supplied to the surface of the substrate without causing flow and waves in a film of the developer solution spread over the surface of the substrate. The uniformity of the line width of a mask pattern produced through the development is thus improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A developing apparatus for developing a substrate, with photoresist applied onto a surface of said substrate and exposed, comprising:

a substrate-holding unit holding said substrate in a horizontal state;

a supply nozzle supplying a developer solution to said substrate, said supply nozzle having a discharge opening formed over a distance almost equal to or longer than the width of an effective region of said substrate;

a moving mechanism moving said supply nozzle from a rear end of said substrate toward a front end of said substrate; and a solution-receiving plate having solution-passing holes for passing the developer solution therethrough toward the back of said solution-receiving plate, said solution-receiving plate being provided at least on the front-end side of said substrate and separated by a slight distance from the front end of said substrate, and said solution-receiving plate and the surface of said substrate being at the same height or said solution-receiving plate being at a height slightly lower than that of the surface of said substrate.

2. The developing apparatus according to claim 1, wherein said substrate is a semiconductor wafer and said solution-receiving plate is provided along a front half of the perimeter of said semiconductor wafer, the front half of the perimeter extending from one end of a diameter of said wafer that is in parallel with said supply nozzle to the other end of said diameter through the front end of said wafer.

3. The developing apparatus according to claim 1, further comprising a cup surrounding said substrate held on said substrate-holding unit and freely moving up/down, wherein
said solution-receiving plate is provided on an upper end of said cup.

4. The developing apparatus according to claim 1, wherein
said substrate is separated from said solution-receiving plate by a distance of 0.5 mm to 3 mm.

5. The developing apparatus according to claim 1, wherein
said solution-receiving plate is placed at a height lower than that of the surface of said substrate by 0.3 mm to 2.5 mm.

6. The developing apparatus according to claim 1, wherein
said solution-receiving plate is inclined downward with respect to the perimeter of said substrate.

7. A developing apparatus for developing a substrate, with photoresist applied onto a surface of said substrate and exposed, comprising:
a substrate-holding unit holding said substrate in a horizontal state;
a supply nozzle supplying a developer solution to said substrate, said supply nozzle having a discharge opening formed over a distance almost equal to or longer than the width of an effective region of said substrate; and
a moving mechanism moving said supply nozzle from a rear end of said substrate toward a front end of said substrate, wherein
said discharge opening is curved toward the front end of said substrate so that two lateral ends of said discharge opening are located back with respect to the center of said discharge opening.

8. A developing apparatus for developing a substrate, with photoresist applied onto a surface of said substrate and exposed, comprising:
a substrate-holding unit holding said substrate in a horizontal state;
a supply nozzle supplying a developer solution to said substrate, said supply nozzle having a discharge opening formed over a distance almost equal to or longer than the width of an effective region of said substrate;
a moving mechanism moving said supply nozzle from a rear end of said substrate toward a front end of said substrate; and
airflow generating means for generating an airflow over the surface of said substrate to prevent a flow from being produced in the developer solution on said substrate.

9. The developing apparatus according to claim 8, wherein
said airflow generating means has air-discharge holes arranged along the perimeter of said substrate, and said airflow generating means is provided to freely move up/down.

10. A developing method for developing a substrate, with photoresist applied onto a surface of said substrate and exposed, comprising the steps of:
holding said substrate in a horizontal state on a substrate-holding unit;
placing, a solution-receiving plate having solution-passing holes, at least on a front-end side of said substrate with respect to the direction in which a supply nozzle is moved, said solution-receiving plate being separated by a slight distance from the front end of said substrate, and said solution-receiving plate and the surface of said substrate being at the same height or said solution-receiving plate being at a height slightly lower than that of the surface of said substrate; and
thereafter moving said supply nozzle for supplying a developer solution to said substrate, said supply nozzle having a discharge opening formed over a distance almost equal to or longer than the width of an effective region of said substrate, said supply nozzle being moved from a rear end of said substrate toward the front end of said substrate to apply said developer solution to the surface of said substrate while a part of said developer solution discharged from a part of said discharge opening located outside said substrate is passed through said solution-passing holes of said solution-receiving plate toward the back of said solution-receiving plate.

11. The developing method according to claim 10, wherein
said solution-receiving plate is provided on an upper end of a cup surrounding said substrate held on said substrate-holding unit and freely moving up/down.

12. The developing method according to claim 10, wherein
said substrate is separated from said solution-receiving plate by a distance of 0.5 mm to 3 mm.

13. The developing method according to claim 10, wherein
said solution-receiving plate is placed at a height lower than that of the surface of said substrate by 0.3 mm to 2.5 mm.

14. The developing method according to claim 10, wherein
said solution-receiving plate is inclined downward with respect to the perimeter of said substrate.

* * * * *